Figure 1:
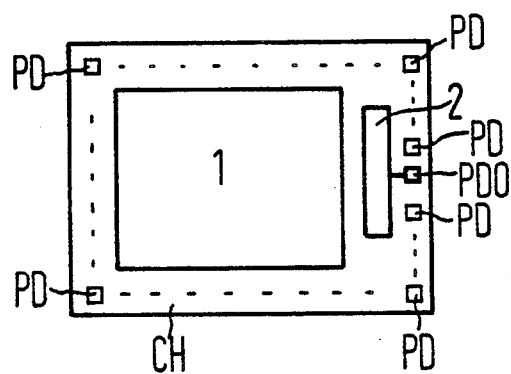

United States Patent [19]

Pribyl et al.

[11] Patent Number: 5,027,322

[45] Date of Patent: Jun. 25, 1991

[54] CIRCUIT CONFIGURATION FOR IDENTIFICATION OF INTEGRATED SEMICONDUCTOR CIRCUITRIES

[75] Inventors: Wolfgang Pribyl, Graz, Austria; Raymond Sittig, Deerfield, Ill.

[73] Assignee: Siemens Aktiengesellschaft, Munich, Fed. Rep. of Germany

[21] Appl. No.: 546,008

[22] Filed: Jun. 29, 1990

[30] Foreign Application Priority Data

Jun. 29, 1989 [EP] European Pat. Off. ........ 89111870.5

[51] Int. Cl.$^5$ .............................................. G11C 11/40
[52] U.S. Cl. ............................... 365/189.01; 365/201; 365/238; 365/96; 371/22.2
[58] Field of Search ................ 365/78, 189.01, 189.05, 365/182, 201, 238, 94, 96; 371/10, 21

[56] References Cited

U.S. PATENT DOCUMENTS 4,441,167 4/1984 Principi .

FOREIGN PATENT DOCUMENTS 0057645 8/1982 European Pat. Off. .
0066835 12/1982 European Pat. Off. .
0066836 12/1982 European Pat. Off. .
0133955 3/1985 European Pat. Off. .
01446806 6/1985 European Pat. Off. .
3601829 7/1987 Fed. Rep. of Germany .

Primary Examiner—Terrell W. Fears
Attorney, Agent, or Firm—Herbert L. Lerner; Laurence A. Greenberg

[57] ABSTRACT

A circuit configuration for the identification of integrated semiconductor circuitries includes n programmable elements. A common line is connected to the programmable elements. An n-stage serial-parallel shift register has a data input, n parallel outputs, and a clock input for controlling a shift function of the serial-parallel shift register as a function of a clock signal to be applied to the clock input. Transistors each have a drain connected to a respective one of the programmable elements, a source connected to a supply potential, and a gate connected to a respective one of the parallel outputs of the serial-parallel shift register. Instead of n-stage serial-parallel shift register, it is also possible to use a clocked n-stage oscillator, such as a ring oscillator, or an n-stage counter, such as ring counter.

14 Claims, 2 Drawing Sheets

CIRCUIT CONFIGURATION FOR IDENTIFICATION OF INTEGRATED SEMICONDUCTOR CIRCUITRIES

The invention relates to a circuit configuration for the identification of integrated semiconductor circuitries.

Configurations for identifying integrated semiconductor circuitries are already known from Published European Application Nos. 0 066 835 A2, 0 066 836 A2 and 0 133 955 A1. They are used to enable "jotting down" specialized circuitry properties such as speed classification and possible operating modes of the circuitry on the semiconductor chip itself (such as page mode and nibble mode in integrated semiconductor memories).

However, the devices proposed heretofore have two substantial disadvantages: First, only a very narrowly limited number of identification characteristics can be incorporated into the circuitries. Second, some of the characteristics (as in Published European Application No. 0 066 835 A2) can only be evaluated on what is known as the wafer plane.

It is accordingly an object of the invention to provide a circuit configuration for the identification of integrated semiconductor circuitries, which overcomes the hereinaforementioned disadvantages of the heretofore-known devices of this general type, which requires minimum space and yet can contain the largest possible number of identification characteristics (such as a batch number), and which has identification characteristics that can be read out even after the circuitries have been encapsulated into a housing.

With the foregoing and other objects in view there is provided, in accordance with the invention, a circuit configuration for the identification of integrated semiconductor circuitries, comprising n programmable elements, a common line connected to the programmable elements, an n-stage serial-parallel shift register having a data input, n parallel outputs, and a clock input for controlling a shift function of the serial-parallel shift register as a function of a clock signal to be applied to the clock input, and transistors each having a drain connected to a respective one of the programmable elements, a source connected to a first supply potential, and a gate connected to a respective one of the parallel outputs of the serial-parallel shift register.

In accordance with another feature of the invention, the programmable elements are mechanically, thermally or chemically disconnectable means.

In accordance with a further feature of the invention, the programmable elements are disconnectable means in the form of resistors.

In accordance with an added feature of the invention, the resistors are transistors connected as resistors.

In accordance with an additional feature of the invention, the programmable elements are laser fuses.

In accordance with yet another feature of the invention, the programmable elements are disconnectable conductor tracks.

In accordance with yet a further feature of the invention, there are provided means for connecting the common line to a second supply potential with high impedance.

In accordance with yet an added feature of the invention, there is provided a clocked n-stage oscillator or an n-stage counter instead of the shift register.

In accordance with a concomitant feature of the invention, the oscillator is a ring oscillator or the counter is a ring counter.

Other features which are considered as characteristic for the invention are set forth in the appended claims.

Although the invention is illustrated and described herein as embodied in a circuit configuration for the identification of integrated semiconductor circuitries, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
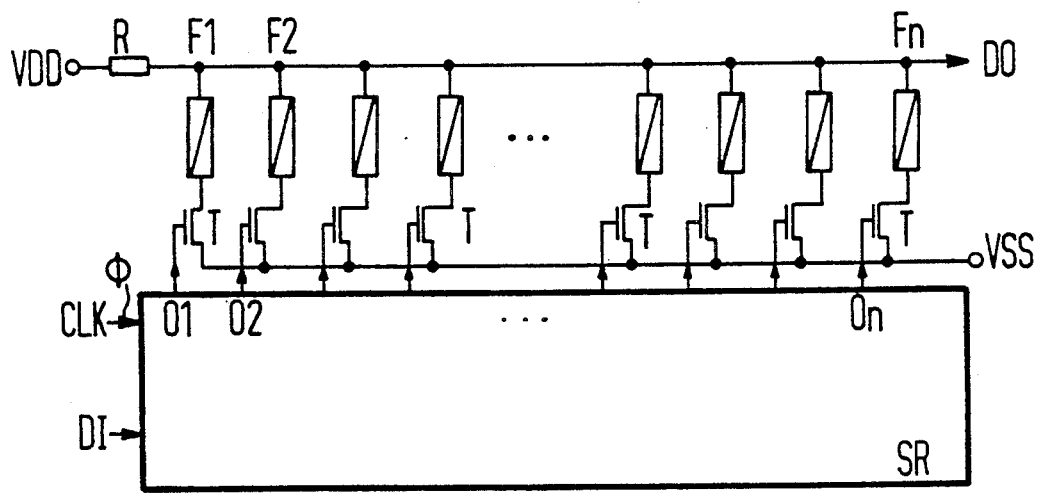
Figure 3:
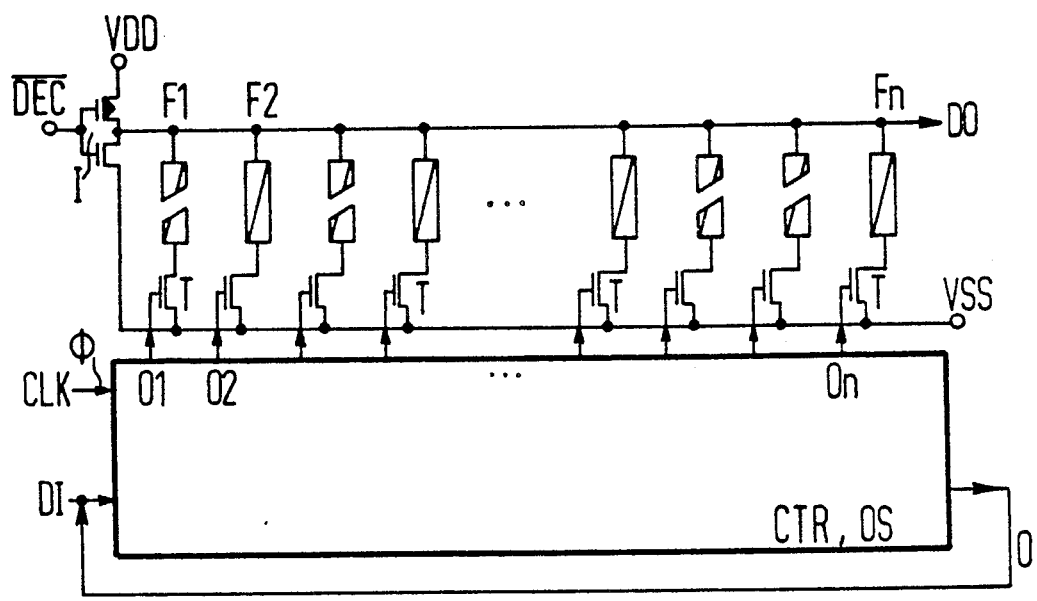
Figure 4:
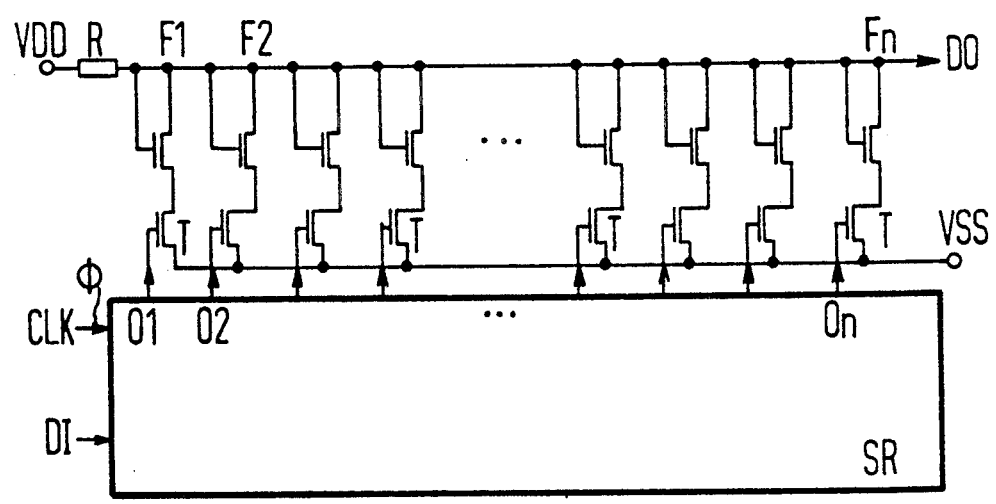

FIG. 1 is a diagrammatic plan view of a circuit configuration according to the invention in an integrated semiconductor circuitry; and FIGS. 2-4 are schematic and block circuit diagrams showing various embodiments of the invention, some of them in encoded state.

Referring now to the figures of the drawing in detail and first, particularly, to FIG. 1 thereof, there is seen a highly diagrammatic plan view showing a semiconductor chip CH of an integrated semiconductor circuitry, having a semiconductor circuit 1 specifically integrated for the semiconductor circuitry, and connection pads PD thereof. Additionally shown on the chip CH is a circuit configuration 2 according to the invention. The size ratio between the circuit configuration 2 and the integrated semiconductor circuit 1 is essentially overly largely dimensioned as compared with the actual conditions that are technically necessary. However, this is done for the sake of easier comprehension of the illustration. As seen in FIGS. 1 and 2, a data output that is constructed as a common line DO of the circuit configuration 2 is guided along a connection pad PDO which is especially assigned to it on the semiconductor chip CH, so that the data output is accessible from outside the component through connection pins. However, if a suitable multiplexer is used, an existing connection pad PD on the chip CH can be used as a connection pad PDO for the data output DO. The data output can also be connected to parts of the integrated semiconductor circuit 1.

The embodiment of FIG. 2 shows the circuit configuration 2 according to the invention in greater detail. It contains n (n = a natural number) programmable elements F1 ... Fn and n transistors T. On one hand, the programmable elements F1 ... Fn are connected to the common line DO forming the data output and on the other they are connected to the drains of the transistors T. The sources of the transistors T are connected to a first supply potential VSS. The gates of the transistors T are each connected to a respective parallel output O1 ... On of a serial-parallel shift register SR. FIG. 2 also shows a data input DI of the serial-parallel shift register SR and a clock input CLK. A datum present at the data input DI can be shifted bit by bit through the n stages of the serial-parallel shift register SR, with the aid of a clock signal $\phi$ that can be applied thereto.

The invention can be constructed in various advantageous embodiments, listed as follows: In one embodiment, the programmable elements F1 ... Fn are mechanically, thermally or chemically disconnectable means, in particular resistors, transistors wired as resistors (as in FIG. 4) or laser fuses (as in FIGS. 2 and 3). However, they may also be disconnectable conductor tracks.

It is also preferable to construct the common line DO in such a way that it can be connected with high impedance to a second supply potential VDD. In FIGS. 2 and 4, this is accomplished through the use of a high-impedance resistor R (with a resistance that is, for instance, at least 10 times as high as that of a programmable element F). In the embodiment of FIG. 3, the high-impedance connection is accomplished with the aid of a CMOS inverter I, having a p-channel transistor which is dimensioned in such a way that its channel resistance is of high impedance. The inverter I is triggered with a decoder signal $\overline{DEC}$ at the input thereof. If the identification is to be performed (that is, if the code word represented by the programmed programmable elements F1 . . . Fn is to be read out), then the decoding signal $\overline{DEC}$ assumes a low value, as a result of which the common line DO is connected with high impedance to the second supply potential VDD. Otherwise, the decoding signal $\overline{DEC}$ assumes a high value, as a result of which the common line DO is connected to the first supply potential VSS. This assures that the common line DO always has a defined potential. This is important, particularly whenever the common line DO of the circuit configuration 2 is still in any way connected with other parts of the integrated semiconductor circuit 1, and in particular is still connected with input stages thereof (in CMOS technology, as is well known, no input can be allowed to electrically "float").

FIG. 3 shows still another advantageous embodiment of the invention: Instead of the n-stage serial-parallel shift register SR, a clocked n-stage oscillator OS is used. An n-stage counter is likewise usable instead of the shift register SR or oscillator OS. An existing serial output 0 of the oscillator OS or of a counter can be fed back to the data input DI, resulting in a ring oscillator or ring counter.

When n programmable elements F1 . . . Fn and an n-stage serial-parallel shift register SR (or counter or oscillator OS) is used, the invention enables programming of a normal state (all n programmable elements F1 . . . Fn are non-programmed) and $2^n - 1$ different code values. This high number of code values, given the small surfaces typically available in the field of integrated semiconductor circuits, cannot be provided in the known prior art.

The programmed code or the (non-programmed) normal state can be read out in operation as follows (assuming positive logic): The serial-parallel shift register SR is clocked forward by means of the clock signal $\phi$ at least (n − 1) times, whereupon a logical 0 is present at the data input DI. In an ensuing next occurrence of the clock signal $\phi$, a logical 1 is applied to the data input DI and is taken over or transferred into the first stage of the serial-parallel shift register SR. As a result, the first parallel output 01 assumes the value of logical 1, while the remaining parallel outputs O2 . . . On remain at logical 0. Therefore the transistor T associated with the first parallel output 1 is electrically conductive, while the remaining transistors T are blocked. If the first programmable element F1 is not programmed (as shown in FIG. 2), then the first supply potential VSS reaches the common line DO, through the transistor T associated with the first parallel output 01, and the common line assumes the state of logical 0. However, if the first programmable element F1 is programmed (as shown in FIG. 3), then the high-impedance connection with the second supply potential VDD affects the common line DO, and it remains at the state of logical 1.

Upon the next occurrence (and all further occurrences) of the clock signal $\phi$, a logical 0 is applied to the data input DI. This causes the logical 1, which was previously taken over or transferred into the first stage of the serial parallel shift register SR, to be shifted onward into the (respective) next stage of the serial-parallel shift register SR. At the same time a logical 0 is shifted into the preceding stage. Correspondingly, the second parallel output 02 (or the respective further parallel output 03 . . . On) assumes the state of logical 1, and the remaining parallel outputs 01, 03, . . . , On (or 01, 02, 04, . . . , On, etc.) have the state of logical 0. The programmable element F2 . . . Fn that is connected, through the transistor T assigned to it, to the parallel output 02 . . . On that has the state of logical 1 determines whether the common line DO assumes the value of logical 1 (programmed state) or logical 0 (non-programmed state), by its state (programmed or not programmed). In this way, the n bits of the programmed code value can be read out.

We claim:

1. Circuit configuration for the identification of integrated semiconductor circuitries, comprising:
   n programmable elements,
   a common line connected to said programmable elements,
   an n-stage serial-parallel shift register having a data input, n parallel outputs, and a clock input for controlling a shift function of said serial-parallel shift register as a function of a clock signal to be applied to the clock input, and
   transistors each having a drain connected to a respective one of said programmable elements, a source connected to a supply potential, and a gate connected to a respective one of the parallel outputs of said serial-parallel shift register.

2. Circuit configuration according to claim 1, wherein said programmable elements are mechanically disconnectable means.

3. Circuit configuration according to claim 1, wherein said programmable elements are thermally disconnectable means.

4. Circuit configuration according to claim 1, wherein said programmable elements are chemically disconnectable means.

5. Circuit configuration according to claim 1, wherein said programmable elements are disconnectable means in the form of resistors.

6. Circuit configuration according to claim 5, wherein said resistors are transistors connected as resistors.

7. Circuit configuration according to claim 1, wherein said programmable elements are laser fuses.

8. Circuit configuration according to claim 1, wherein said programmable elements are disconnectable conductor tracks.

9. Circuit configuration according to claim 1, including means for connecting said common line to another supply potential with high impedance.

10. Circuit configuration for the identification of integrated semiconductor circuitries, comprising:
   n programmable elements,
   a common line connected to said programmable elements, a clocked n-stage oscillator having a data input, n parallel outputs, and a clock input for controlling a start function of said oscillator as a function of a clock signal to be applied to the clock input, and transistors each having a drain connected to a respective one of said programmable elements, a source connected to a supply potential, and a gate connected to a respective one of the parallel outputs of said oscillator.

11. Circuit configuration according to claim 10, wherein said oscillator is a ring oscillator.

12. Circuit configuration for the identification of integrated semiconductor circuitries, comprising:

n programmable elements, a common line connected to said programmable elements, an n-stage counter having a data input, n parallel outputs, and a clock input for controlling a counting function of said counter as a function of a clock signal to be applied to the clock input, and transistors each having a drain connected to a respective one of said programmable elements, a source connected to a supply potential, and a gate connected to a respective one of the parallel outputs of said counter.

13. Circuit configuration according to claim 12, wherein said counter is a ring counter.

14. Circuit configuration for the identification of integrated semiconductor circuitries, comprising:

n programmable elements, a common line connected to said programmable elements, means having a data input, n parallel outputs, and a clock input for consecutively activating the parallel outputs as a function of a clock signal to be applied to the clock input, and transistors each having a drain connected to a respective one of said programmable elements, a source connected to a supply potential, and a gate connected to a respective one of the parallel outputs of said serial-parallel shift register.

* * * * *